(12) United States Patent
Chang

(10) Patent No.: US 11,012,082 B1
(45) Date of Patent: May 18, 2021

(54) MULTIPHASE CLOCK GENERATOR AND ASSOCIATED FREQUENCY SYNTHESIZER

(71) Applicant: eMemory Technology Inc., Hsin-Chu (TW)

(72) Inventor: Che-Wei Chang, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 16/924,241

(22) Filed: Jul. 9, 2020

(30) Foreign Application Priority Data

Mar. 23, 2020 (TW) .................................. 109109593

(51) Int. Cl.
| | | |
|---|---|---|
| *H03K 5/134* | (2014.01) | |
| *H03K 5/14* | (2014.01) | |
| *H03L 7/081* | (2006.01) | |
| *H03L 7/18* | (2006.01) | |
| *H03L 7/07* | (2006.01) | |
| *H03B 21/02* | (2006.01) | |

(52) U.S. Cl.
CPC ............... *H03L 7/18* (2013.01); *H03B 21/02* (2013.01); *H03K 5/134* (2014.07); *H03K 5/14* (2013.01); *H03L 7/07* (2013.01); *H03L 7/0812* (2013.01)

(58) Field of Classification Search
CPC .... H03B 27/00; H03K 3/0231; H03K 3/0315; H03K 3/0322; H03K 5/133–135; H03K 5/14; H03K 5/1504; H03K 5/15046; H03K 5/1508; H03L 7/0812
See application file for complete search history.

(56) References Cited

U.S. PATENT DOCUMENTS

| | | | | |
|---|---|---|---|---|
| 4,623,851 A | * | 11/1986 | Abou ................... | H03K 3/0231 331/111 |
| 4,785,262 A | * | 11/1988 | Ryu ...................... | H03K 3/011 327/114 |
| 5,585,765 A | * | 12/1996 | O'Shaughnessy ...... | G05F 3/247 327/541 |
| 5,668,508 A | * | 9/1997 | Pulvirenti .............. | H03K 3/011 331/111 |
| 6,342,817 B1 | * | 1/2002 | Crofts .................. | H03K 3/0231 331/1 R |
| 6,784,725 B1 | | 8/2004 | Wadhwa et al. | |
| 6,933,791 B2 | | 8/2005 | Chen | |
| 2018/0351538 A1 | * | 12/2018 | Tanaka ............... | H03K 3/02315 |

* cited by examiner

*Primary Examiner* — Levi Gannon
(74) *Attorney, Agent, or Firm* — WPAT, PC

(57) ABSTRACT

A multiphase clock generator includes a current mirror, a voltage controller, a pseudo-resistor circuit and a first delaying circuit. The current mirror includes a receiving terminal, a first mirroring terminal and a second mirroring terminal. The voltage controller is connected with the receiving terminal of the current mirror. A feedback terminal of the voltage controller is connected with the first mirroring terminal of the current mirror. A first terminal of the pseudo-resistor circuit is connected with the first mirroring terminal of the current mirror. A second terminal of the pseudo-resistor circuit is connected with a ground terminal. The first delaying circuit is connected with the second terminal of the pseudo-resistor circuit. An input terminal of the first delaying circuit receives a first input clock signal. An output terminal of the first delaying circuit generates a first delayed clock signal.

16 Claims, 8 Drawing Sheets

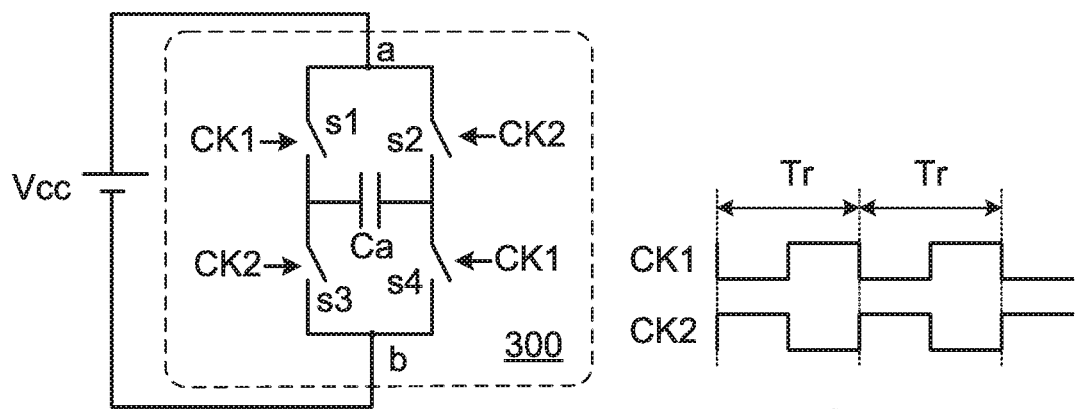
FIG. 3A
FIG. 3B
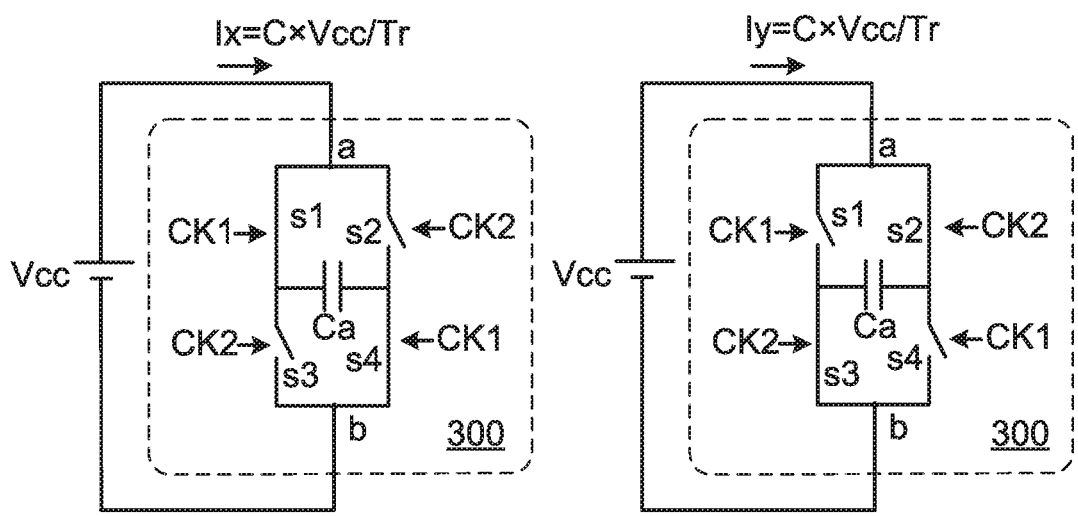
FIG. 3C
FIG. 3D

MULTIPHASE CLOCK GENERATOR AND ASSOCIATED FREQUENCY SYNTHESIZER

This application claims the benefit of Taiwan Patent Application No. 109109593, filed Mar. 23, 2020, the subject matter of which is incorporated herein by reference.

FIELD OF THE INVENTION

The present invention relates to a multiphase clock generator and an associated circuit, and more particularly to an open-loop multiphase clock generator and an associated frequency synthesizer.

BACKGROUND OF THE INVENTION

As known, all electronic chips are operated according to clock signals. For example, an AI chip comprises a neural network system. The neural network system is defined by plural neurons and plural neuron connection weights collaboratively. Moreover, the neural network system can be used for executing various detection and recognition behaviors. Generally, the neuron connection weights of the neural network system are recorded in an analog non-volatile memory. That is, the analog non-volatile memory is suitably applied to the AI chip. Moreover, the computing speed of the AI chip is determined according to the frequency of a clock signal. A frequency synthesizer is able to generate plural clock signals with various frequencies.

The conventional frequency synthesizer comprises a close-loop phase lock loop (PLL) circuit or a combination of a delay lock loop (DLL) circuit and a combinational logic circuit.

FIG. 1A is a schematic circuit diagram illustrating a conventional frequency synthesizer with a phase lock loop circuit. FIG. 1B is a schematic waveform diagram illustrating associated signals for the conventional frequency synthesizer as shown in FIG. 1A. The frequency synthesizer 100 comprises a phase lock loop circuit and a combinational logic circuit 190. The phase lock loop circuit is a multiphase clock generator. The phase lock loop circuit comprises a phase frequency detector (PFD) 110, a charge pump 120, a loop filter 130, a voltage controlled oscillator (VCO) 140 and a frequency divider 150.

The phase frequency detector 110 receives a reference signal CKr and a divided clock signal CKd, and generates a control signal Sctr1 to the charge pump 120.

The charge pump 120 comprises a charging path and a discharging path. According to the control signal Sctr1, the charging path or the discharging path generates a driving current Ic to the loop filter 130.

The loop filter 130 comprises an RC circuit. According to the driving current Ic from the charge pump 120, a charge/discharge control operation is performed on the RC circuit. Consequently, the loop filter 130 generates a tuned voltage Vtune to the voltage controlled oscillator 140.

The voltage controlled oscillator 140 receives the tuned voltage Vtune and generates plural tuned clock signals CKt_1~CKt_n with the same frequency. When the tuned voltage Vtune is changed, the frequency of the tuned clock signals CKt_1~CKt_n is correspondingly changed. For example, if n=4, the voltage controlled oscillator 140 generates four tuned clock signals CKt_1~CKt_4. Moreover, the phase difference between every two adjacent ones of the four tuned clock signals CKt_1~CKt_4 is 90 degrees.

The frequency divider 150 receives a tuned clock signal CKt_n and performs a frequency division on the tuned clock signal CKt_n. Consequently, the divided clock signal CKd is generated to the phase frequency detector 110. For example, if the frequency of the reference signal CKr is Fref, the tuned frequency Ft of the tuned clock signals CKt_1~CKt_n is N times the frequency Fref. That is, Ft=N×Fref, wherein N is an integer.

After the combinatorial logic circuit 190 receives the tuned clock signals CKt_1~CKt_n and performs a logic operation on the tuned clock signals CKt_1~CKt_n, an output clock signal CKout is generated. The combinatorial logic circuit 190 comprises plural logic circuits. The plural logic circuits generate the output clock signal CKout according to the tuned clock signals CKt_1~CKt_n. The output frequency of the output clock signal CKout is a specified multiple of the tuned frequency Ft.

For example, the voltage controlled oscillator 140 generates four tuned clock signals CKt_1~CKt_4. Consequently, as shown in FIG. 1B, the phase difference between every two adjacent ones of the four tuned clock signals CKt_1~CKt_4 is 90 degrees. For example, the combinatorial logic circuit 190 is an XOR gate. After the tuned clock signals CKt_1 and CKt_2 are inputted into the combinatorial logic circuit 190, the output clock signal CKout is generated. The output frequency Fout of the output clock signal CKout is two times the tuned frequency Ft.

It is noted that the circuitry structure of the combinatorial logic circuit is not restricted. That is, various logic gates may be combined as the combinatorial logic circuit to generate plural clock signals with various frequencies.

FIG. 2 is a schematic circuit diagram illustrating a conventional frequency synthesizer with a delay lock loop circuit. The frequency synthesizer 200 comprises a delay lock loop circuit and a combinational logic circuit 290. The delay lock loop circuit is a multiphase clock generator. The delay lock loop circuit comprises a phase detector (PD) 210, a charge pump 220, a loop filter 230 and a voltage controlled delay line circuit (VCDL) 240.

The phase frequency detector 210 receives a reference signal CKr and a tuned clock signal CKt_n, and generates a control signal Sctr1 to the charge pump 220.

According to the control signal Sctr1, the charge pump 220 generates a driving current Ic to the loop filter 230. According to the driving current Ic, the loop filter 230 generates a tuned voltage Vtune to the voltage controlled delay line circuit 240.

The voltage controlled delay line circuit 240 receives the reference signal CKr and the tuned voltage Vtune, and generates plural tuned clock signals CKt_1~CKt_n with the same frequency. When the tuned voltage Vtune is changed, the frequency of the tuned clock signals CKt_1~CKt_n is correspondingly changed. For example, if n=4, the voltage controlled delay line circuit 240 generates four tuned clock signals CKt_1~CKt_4. Moreover, the phase difference between every two adjacent ones of the four tuned clock signals CKt_1~CKt_4 is 90 degrees.

After the combinatorial logic circuit 290 receives the tuned clock signals CKt_1~CKt_n and performs a logic operation on the tuned clock signals CKt_1~CKt_n, an output clock signal CKout is generated. The combinatorial logic circuit 190 comprises plural logic circuits. The plural logic circuits generate the output clock signal CKout according to the tuned clock signals CKt_1~CKt_n. The output frequency of the output clock signal CKout is a specified multiple of the tuned frequency Ft.

SUMMARY OF THE INVENTION

The present invention provides an open-loop multiphase clock generator and an associated frequency synthesizer.

An embodiment of the present invention provides a multiphase clock generator. The multiphase clock generator includes a current mirror, a voltage controller, a pseudo-resistor circuit and a first delaying circuit. The current mirror includes a receiving terminal, a first mirroring terminal and a second mirroring terminal. The voltage controller is connected with the receiving terminal of the current mirror. A feedback terminal of the voltage controller is connected with the first mirroring terminal of the current mirror. A first terminal of the pseudo-resistor circuit is connected with the first mirroring terminal of the current mirror. A second terminal of the pseudo-resistor circuit is connected with a ground terminal. The first delaying circuit is connected with the second terminal of the pseudo-resistor circuit. An input terminal of the first delaying circuit receives a first input clock signal. An output terminal of the first delaying circuit generates a first delayed clock signal. The pseudo-resistor circuit includes a first capacitor, a first switch, a second switch, a third switch and a fourth switch. A first terminal of the first switch is connected with the first mirroring terminal of the current mirror. A second terminal of the first switch is connected with a first terminal of the first capacitor. A first terminal of the second switch is connected with the first mirroring terminal of the current mirror. A second terminal of the second switch is connected with a second terminal of the first capacitor. A first terminal of the third switch is connected with the ground terminal. A second terminal of the third switch is connected with the first terminal of the first capacitor. A first terminal of the fourth switch is connected with the ground terminal. A second terminal of the fourth switch is connected with the second terminal of the first capacitor. The first switch and the fourth switch are operated according to a first control clock signal. The second switch and the third switch are operated according to a second control clock signal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 3A is a schematic circuit diagram illustrating a pseudo-resistor circuit according to an embodiment of the present invention;

FIG. 3B is a schematic waveform diagram of a first control clock signal and a second control clock signal;

FIGS. 3C and 3D are schematic circuit diagrams illustrating the operations of the pseudo-resistor circuit as shown in FIG. 3A;

DETAILED DESCRIPTION OF PREFERRED EMBODIMENTS

Figure 1A:
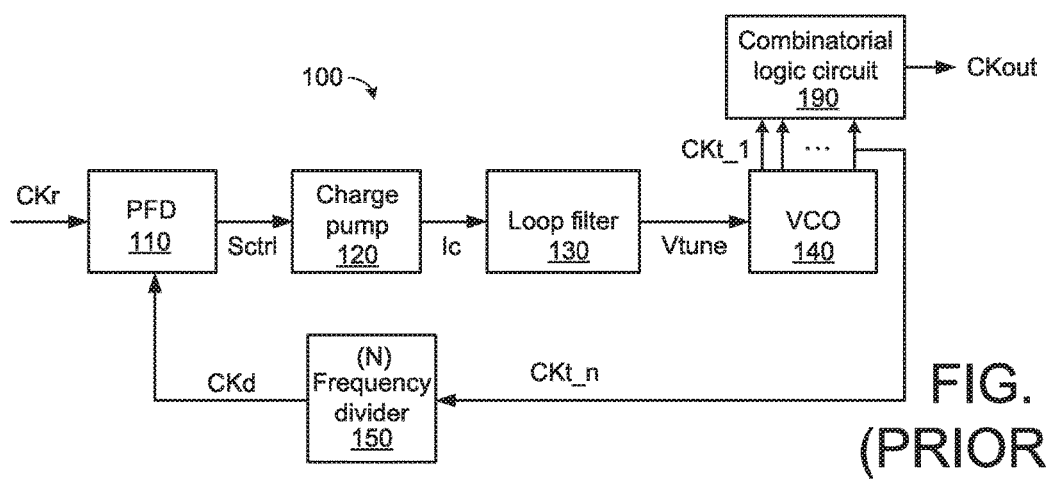
FIG. 1A (prior art) is a schematic circuit diagram illustrating a conventional frequency synthesizer with a phase lock loop circuit.
Figure 1B:
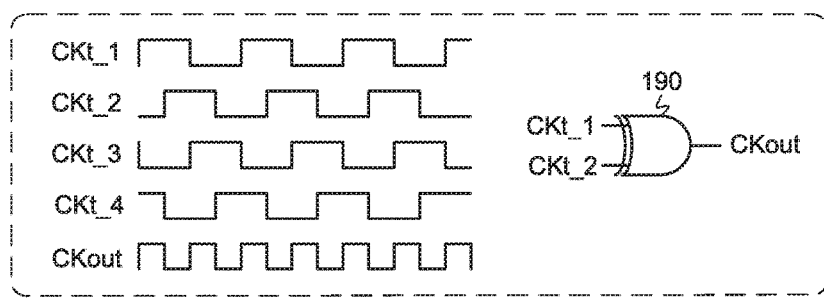
FIG. 1B (prior art) is a schematic waveform diagram illustrating associated signals for the conventional frequency synthesizer as shown in FIG. 1A.
Figure 2:
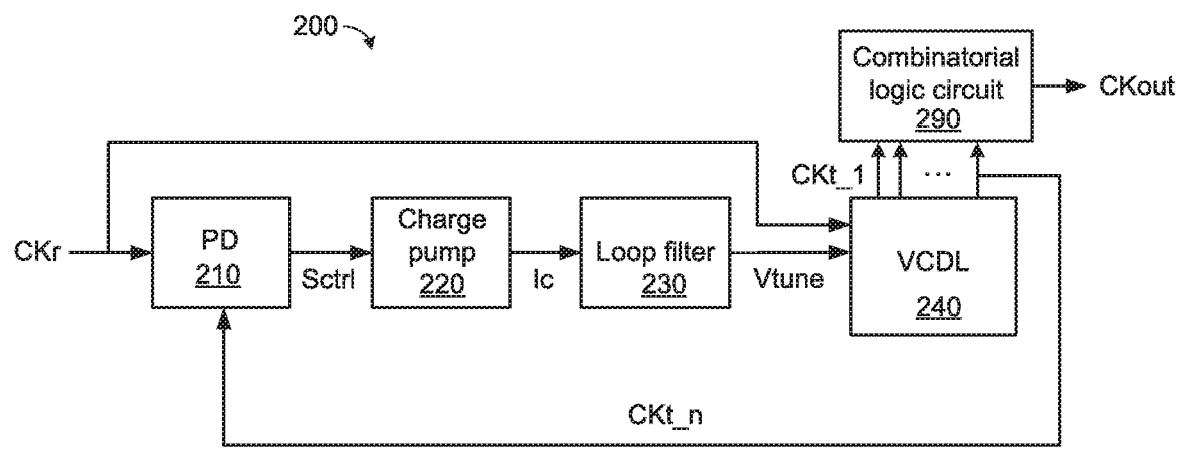
FIG. 2 (prior art) is a schematic circuit diagram illustrating a conventional frequency synthesizer with a delay lock loop circuit.

The present invention provides a pseudo-resistor circuit. FIG. 3A is a schematic circuit diagram illustrating a pseudo-resistor circuit according to an embodiment of the present invention. FIG. 3B is a schematic waveform diagram of a first control clock signal and a second control clock signal. FIGS. 3C and 3D are schematic circuit diagrams illustrating the operations of the pseudo-resistor circuit as shown in FIG. 3A.

The pseudo-resistor circuit 300 comprises a capacitor Ca and four switches s1~s4. The node a is a first terminal of the pseudo-resistor circuit 300. The node b is a second terminal of the pseudo-resistor circuit 300. Moreover, the first terminal and the second terminal of the pseudo-resistor circuit 300 are connected with a supply voltage Vcc.

A first terminal of the switch s1 is connected with the node a. A second terminal of the switch s1 is connected with a first terminal of the capacitor Ca. A first terminal of the switch s2 is connected with the node a. A second terminal of the switch s2 is connected with a second terminal of the capacitor Ca. A first terminal of the switch s3 is connected with the node b. A second terminal of the switch s3 is connected with the first terminal of the capacitor Ca. A first terminal of the switch s4 is connected with the node b. A second terminal of the switch s4 is connected with a second terminal of the capacitor Ca. The switch s1 and the switch s4 are operated according to a first control clock signal CK1. The switch s2 and the switch s3 are operated according to a second control clock signal CK2.

As shown in FIG. 3B, the first control clock signal CK1 and the second control clock signal CK2 are complementary to each other. The first control clock signal CK1 and the second control clock signal CK2 are operated at the same frequency. For example, the first control clock signal CK1 and the second control clock signal CK2 have the same period Tr. In an embodiment, the first control clock signal CK1 is generated by a quartz oscillator For example, the switches s1, s2, s3 and s4 are in a close state when the control clock signal is in a high voltage level state, and the switches s1, s2, s3 and s4 are in an open state when the control clock signal is in a low voltage level state.

Please refer to FIG. 3C. When the first control clock signal CK1 is in the high voltage level state and the second control clock signal CK2 is in the low voltage level state, the switch s1 and the switch s4 are in the close state and the switch s2 and the switch s3 are in the open state. Meanwhile, a current Ix flows through the node a, the switch s1, the capacitor Ca, the switch s4 and the node b of the pseudo-resistor circuit 300. Moreover, the current Ix=C×Vcc/Tr, wherein C is the capacitance of the capacitor Ca.

Please refer to FIG. 3D. When the first control clock signal CK1 is in the low voltage level state and the second control clock signal CK2 is in the high voltage level state, the switch s1 and the switch s4 are in the open state and the switch s2 and the switch s3 are in the close state. Meanwhile, a current Iy flows through the node a, the switch s2, the capacitor Ca, the switch s3 and the node b of the pseudo-resistor circuit 300. Moreover, the current Iy=C×Vcc/Tr.

Consequently, a total current I flowing through the pseudo-resistor circuit 300 may be expressed by the following formula: I=Ix+Iy=2×C×Vcc/T, and an equivalent resistance Req of the pseudo-resistor circuit 300 may be expressed by the following formula: Req=Vcc/I=1/(2×C×Fr), wherein Fr is the frequency of the first control clock signal CK1, and Fr=1/Tr. In other words, if the capacitance C of the capacitor Ca is fixed, the equivalent resistance Req of the pseudo-resistor circuit 300 is related to the frequency Fr of the first control clock signal CK1. For example, the higher frequency Fr of the first control clock signal CK1 corresponds to the lower equivalent resistance Req, and the lower frequency Fr of the first control clock signal CK1 corresponds to the higher equivalent resistance Req.

Figure 4:
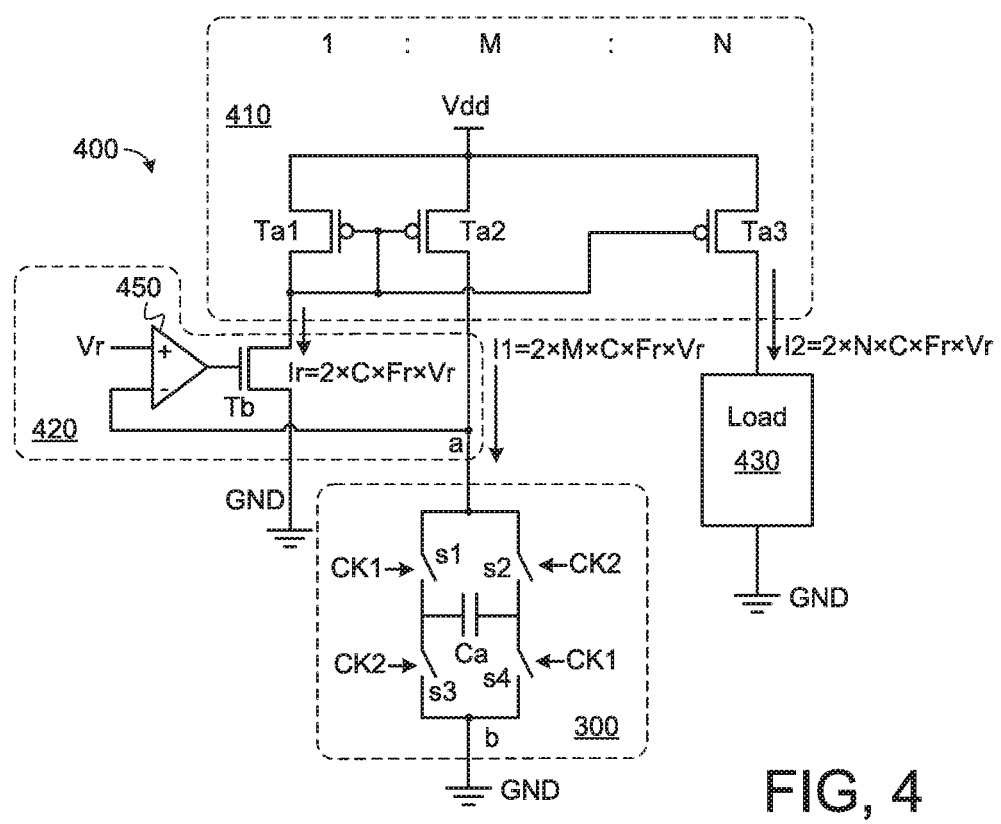
FIG. 4 is a schematic circuit diagram illustrating a frequency-to-current converting circuit using the pseudo-resistor circuit.

FIG. 4 is a schematic circuit diagram illustrating a frequency-to-current converting circuit using the pseudo-resistor circuit. As shown in FIG. 4, the frequency-to-current converting circuit 400 comprises a current mirror 410, a pseudo-resistor circuit 300, a voltage controller 420 and a load 430. The structure and the operating principle of the pseudo-resistor circuit 300 are identical to those of FIG. 3A, and not redundantly described herein.

The current mirror 410 comprises transistors Ta1, Ta2 and Ta3. A first drain/source terminal of the transistor Ta1 receives a supply voltage Vdd. A second drain/source terminal of the transistor Ta1 is a receiving terminal of the current mirror 410. A first drain/source terminal of the transistor Ta2 receives the supply voltage Vdd. A second drain/source terminal of the transistor Ta2 is a first mirroring terminal of the current mirror 410. A gate terminal of the transistor Ta2 is connected with a gate terminal of the transistor Ta1. A first drain/source terminal of the transistor Ta3 receives the supply voltage Vdd. A second drain/source terminal of the transistor Ta3 is a second mirroring terminal of the current mirror 410. A gate terminal of the transistor Ta3 is connected with the gate terminal of the transistor Ta1. Moreover, the aspect ratio between the transistors Ta1, Ta2 and Ta3 is 1:M:N.

The first mirroring terminal of the current mirror 410 is connected with a first terminal of the pseudo-resistor circuit 300 (i.e., the node a). The receiving terminal of the current mirror 410 is connected with the voltage controller 420. The second mirroring terminal of the current mirror 410 is connected with a first terminal of the load 430. A second terminal of the pseudo-resistor circuit 300 (i.e., the node b) is connected with a ground terminal GND. A second terminal of the load 430 is connected with the ground terminal GND.

The voltage controller 420 comprises an operation amplifier 450 and a control transistor Tb. A positive terminal of the operation amplifier 450 receives a control voltage Vr. A negative terminal of the operation amplifier 450 is used as a feedback terminal of the voltage controller 420. Moreover, the negative terminal of the operation amplifier 450 is connected with the first mirroring terminal of the current mirror 410. An output terminal of the operation amplifier 450 is connected with a gate terminal of the control transistor Tb. A first drain/source terminal of the control transistor Tb is connected with the receiving terminal of the current mirror 410. A second drain/source terminal of the control transistor Tb is connected with the ground terminal GND.

When the frequency-to-current converting circuit 400 is enabled, the receiving terminal of the current mirror 410 receives a current Ir. The current Ir may be expressed by the following formula: Ir=Vr/Req=2×C×Fr×Vr. The first mirroring terminal of the current mirror 410 generates a current I1. The second mirroring terminal of the current mirror 410 generates a current I2. Since the aspect ratio between the transistors Ta1, Ta2 and Ta3 is 1:M:N, the current I1 may be expressed by the following formula: I1=2×M×C×Fr×Vr, and the current I2 may be expressed by the following formula: I2=2×N×C×Fr×Vr. In the above formulae, C is the capacitance of the capacitor Ca, and Fr is the frequency of the first control clock signal CK1.

As mentioned above, the second mirroring terminal of the current mirror 410 generates the current I2 to the load 430. The current I2 is related to the frequency Fr of the first control clock signal CK1. For example, the capacitance C of the capacitor Ca and the magnitude of the control voltage Vr are constants. The higher frequency Fr of the first control clock signal CK1 corresponds to the higher magnitude of the current I2. The lower frequency Fr of the first control clock signal CK1 corresponds to the lower magnitude of the current I2.

Furthermore, the prevent invention provides a multiphase clock generator and an associated frequency synthesizer according to the characteristics of the frequency-to-current converting circuit 400.

Figure 5A:
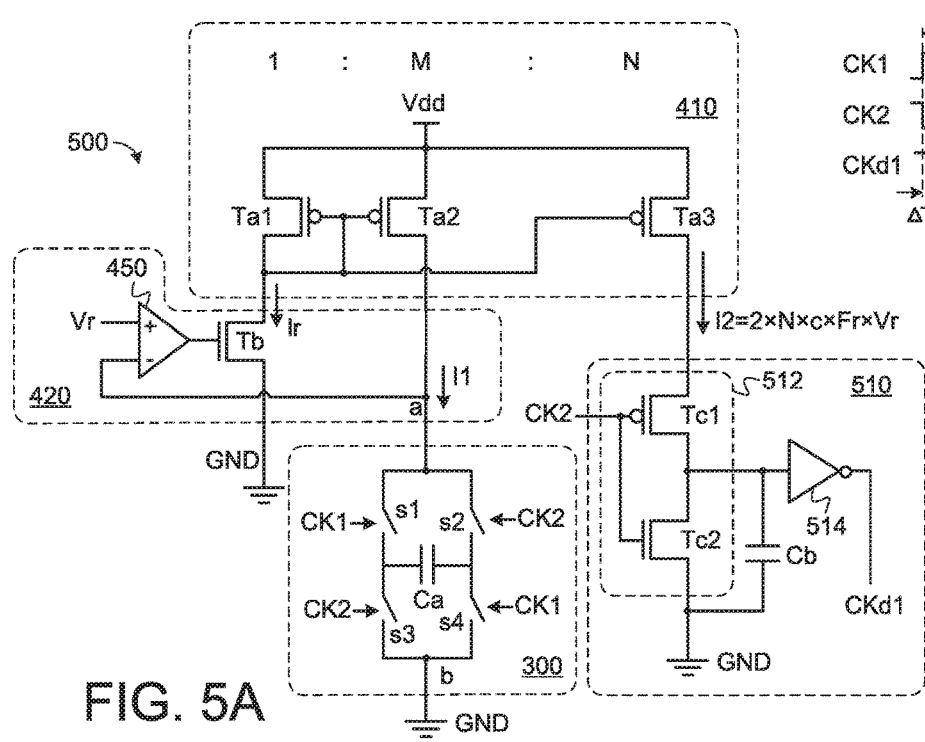
FIG. 5A is a schematic circuit diagram illustrating a multiphase clock generator according to a first embodiment of the present invention.
Figure 5B:
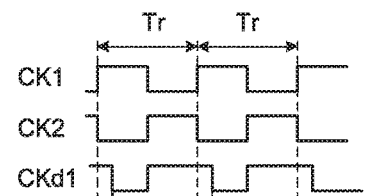
FIG. 5B is a schematic waveform diagram of associated control clock signals for the multiphase clock generator as shown in FIG. 5A.

FIG. 5A is a schematic circuit diagram illustrating a multiphase clock generator according to a first embodiment of the present invention. FIG. 5B is a schematic waveform diagram of associated control clock signals for the multiphase clock generator as shown in FIG. 5A. As shown in FIGS. 5A and 5B, the multiphase clock generator 500 comprises a current mirror 410, a pseudo-resistor circuit 300, a voltage controller 420 and a delaying circuit 510. The structures and the operating principles of the current mirror 410, the pseudo-resistor circuit 300 and the voltage controller 420 are identical to those of FIG. 4, and not redundantly described herein.

The delaying circuit 510 comprises two inverters 512, 514 and a capacitor Cb1. The delaying circuit 510 has an input terminal and an output terminal. An input terminal of the inverter 512 is used as the input terminal of the delaying circuit 510. An output terminal of the inverter 514 is used as an output terminal of the delaying circuit 510.

The input terminal of the inverter 512 receives the second control clock signal CK2. An output terminal of the inverter 512 is connected with an input terminal of the inverter 514. The output terminal of the inverter 514 generates a delayed clock signal CKd1. A first terminal of the capacitor Cb1 is connected with the output terminal of the inverter 512. A second terminal of the capacitor Cb1 is connected with the ground terminal GND. A first power terminal of the inverter 512 is connected with the second mirroring terminal of the current mirror 410. A second power terminal of the inverter 512 is connected with the ground terminal GND.

The inverter 512 comprises transistors Tc1 and Tc2. A first drain/source terminal of the transistor Tc1 is connected with the second mirroring terminal of the current mirror 410. A gate terminal of the transistor Tc1 and a gate terminal of the transistor Tc2 receive the second control clock signal CK2. A first drain/source terminal of the transistor Tc2 is connected with a second drain/source terminal of the transistor Tc1 and the output terminal of the inverter 514. A second drain/source terminal of the transistor Tc2 is connected with the ground terminal GND.

In this embodiment, the control voltage Vr received by the voltage controller 420 is equal to a threshold voltage (or a transition voltage) of the inverter 514. Moreover, the size of the capacitor Ca is m times the size of the capacitor Cb1. Consequently, in case that the capacitance of the capacitor Ca is C, the capacitance of the capacitor Cb1 is C/m. The operations of the delaying circuit 510 will be described herein.

When the second control clock signal CK2 is switched from the high voltage level state to the low voltage level state, the transistor Tc1 is turned on and the transistor Tc2 is turned off. Since the capacitor Cb1 receives the current I2, the capacitor Cb1 starts to be charged. When the capacitor Cb1 is charged to the control voltage Vr (i.e., the threshold voltage of the inverter 514), the delayed clock signal CKd1 from the inverter 514 is switched from the high voltage level state to the low voltage level state.

When the second control clock signal CK2 is switched from the low voltage level state to the high voltage level state, the transistor Tc1 is turned off and the transistor Tc2 is turned on. Consequently, the capacitor Cb1 is discharged to a ground voltage (OV), and the delayed clock signal CKd1 from the inverter 514 is switched from the low voltage level state to the high voltage level state.

In case that the time duration of charging the capacitor Cb1 to the control voltage Vr is ΔTf, the electric charge amount Q of the capacitor Cb1 is equal to (C/m)×Vr. Moreover, the time duration ΔTf of charging the capacitor Cb1 to the control voltage Vr may be expressed by the following formula:

$$\Delta Tf = Q/I2 = \frac{(C/m) \times Vr}{2 \times N \times C \times Fr \times Vr} = \frac{Tr}{2 \times N \times m}$$

In the above formula, Tr is the period of the second control clock signal CK2, N is an aspect ratio between the transistors Ta1 and Ta3, and m is the size ratio between the capacitor Ca and the capacitor Cb1.

As shown in FIG. 5B, there is a specified delaying time ΔTf between the falling edge of the second control clock signal CK2 and the falling edge of the delayed clock signal CKd1, wherein the delaying time ΔTf is related to Tr, N and m. In accordance with a feature of the present invention, the multiphase clock generator 500 can accurately control the delaying time ΔTf. Moreover, the delayed clock signal CKd1 is not influenced by the process, the voltage and the temperature.

Figure 5C:
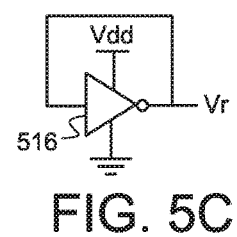
FIG. 5C is a schematic circuit diagram illustrating a threshold voltage generator for the multiphase clock generator as shown in FIG. 5A.

For allowing the control voltage Vr to be equal to the threshold voltage of the inverter 514, a threshold voltage generator with the same structure as the inverter 514 is used. FIG. 5C is a schematic circuit diagram illustrating a threshold voltage generator for the multiphase clock generator as shown in FIG. 5A. The threshold voltage generator comprises an inverter 516. The structure of the inverter 516 is identical to the structure of the inverter 514. An input terminal of the inverter 516 is connected with an output terminal of the inverter 516. A first power terminal of the inverter 516 receives the supply voltage Vdd. A second power terminal of the inverter 516 is connected with the ground terminal GND. The output terminal of the inverter 516 generates the threshold voltage. The threshold voltage is used as the control voltage Vr.

In this embodiment, the inverter 512 of the delaying circuit 510 receives the second control clock signal CK2. It is noted that numerous modifications and alterations may be made while retaining the teachings of the invention. For example, in another embodiment, the inverter 512 receives the first control clock signal CK1. Similarly, there is a fixed delaying time ΔTf between the falling edge of the first control clock signal CK1 and the falling edge of the delayed clock signal CKd1. After the first control clock signal CK1 and the delayed clock signal CKd1 are inputted into a combinatorial logic circuit (not shown), an output clock signal CKout with a specified frequency is generated.

Figure 6:
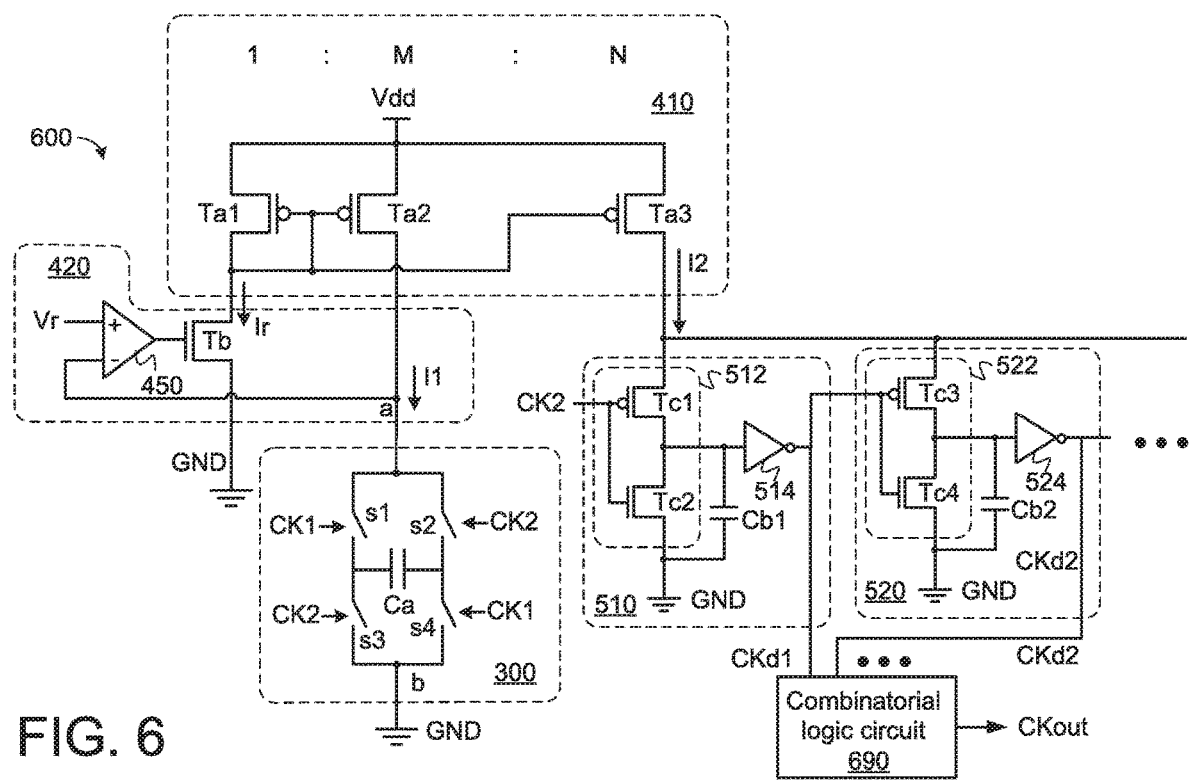
FIG. 6 is a schematic circuit diagram illustrating a multiphase clock generator according to a second embodiment of the present invention.

FIG. 6 is a schematic circuit diagram illustrating a multiphase clock generator according to a second embodiment of the present invention. As shown in FIG. 6, the multiphase clock generator 600 comprises a current mirror 410, a pseudo-resistor circuit 300, a voltage controller 420 and plural delaying circuits. The structures and the operating principles of the current mirror 410, the pseudo-resistor circuit 300 and the voltage controller 420 are identical to those of FIG. 4, and not redundantly described herein. The circuitry structures of the delaying circuits 510 and 520 are identical. The plural delaying circuits 510 and 520 are connected with each other in series to form an open-loop voltage controlled delay line circuit. An input terminal of the first delaying circuit 510 receives the second control clock signal CK2. An input terminal of the second delaying circuit 520 is connected with an output terminal of the first delaying circuit 510. That is, the input terminal of each delaying circuit is connected with an output terminal of the previous delaying circuit. The first delaying circuit 510 generates a delayed clock signal CKd1. The second delaying circuit 520 generates a delayed clock signal CKd2. During the normal operation of the multiphase clock generator 600, there is a fixed phase relationship between the delayed clock signal CKd1 and the delayed clock signal CKd2. For succinctness, only the delaying circuits 510 and 520 are shown in the drawings. In some other embodiments, more than two delaying circuits are connected with each other in series to form an open-loop voltage controlled delay line circuit.

For example, in an embodiment, the multiphase clock generator 600 comprises four delaying circuits. The four delaying circuits are connected with each other in series to form an open-loop voltage controlled delay line circuit. The first delaying circuit generates a first delayed clock signal CKd1. The falling edge of the first delayed clock signal CKd1 lags the second control clock signal CK2 by one delaying time ΔTf. The second delaying circuit generates a second delayed clock signal CKd2. The falling edge of the second delayed clock signal CKd2 lags the first delayed clock signal CKd1 by one delaying time ΔTf. The third delaying circuit generates a third delayed clock signal CKd3. The falling edge of the third delayed clock signal CKd3 lags the second delayed clock signal CKd2 by one delaying time ΔTf. The fourth delaying circuit generates a fourth delayed clock signal CKd4. The falling edge of the fourth delayed clock signal CKd4 lags the third delayed clock signal CKd3 by one delaying time ΔTf.

Please refer to FIG. 6 again. The multiphase clock generator 600 and a combinatorial logic circuit 690 are combined as a frequency synthesizer. After the combinatorial logic circuit 690 receives all delayed clock signals CKd1 and CKd2 and performs a logic operation on the delayed clock signals CKd1 and CKd2, an output clock signal CKout with a specified frequency is generated. The delaying time ΔTf may be expressed by the following formula: ΔTf=Tr/(2×N×m). For example, in case that the period of the output clock signal CKout is 2×ΔTf, the frequency of the output clock signal CKout is equal to N×m×Fr. Of course, the multiphase clock generator 600 may generate plural output clock signals with different frequencies according to all delayed clock signals CKd1 and CKd2.

Figure 7:
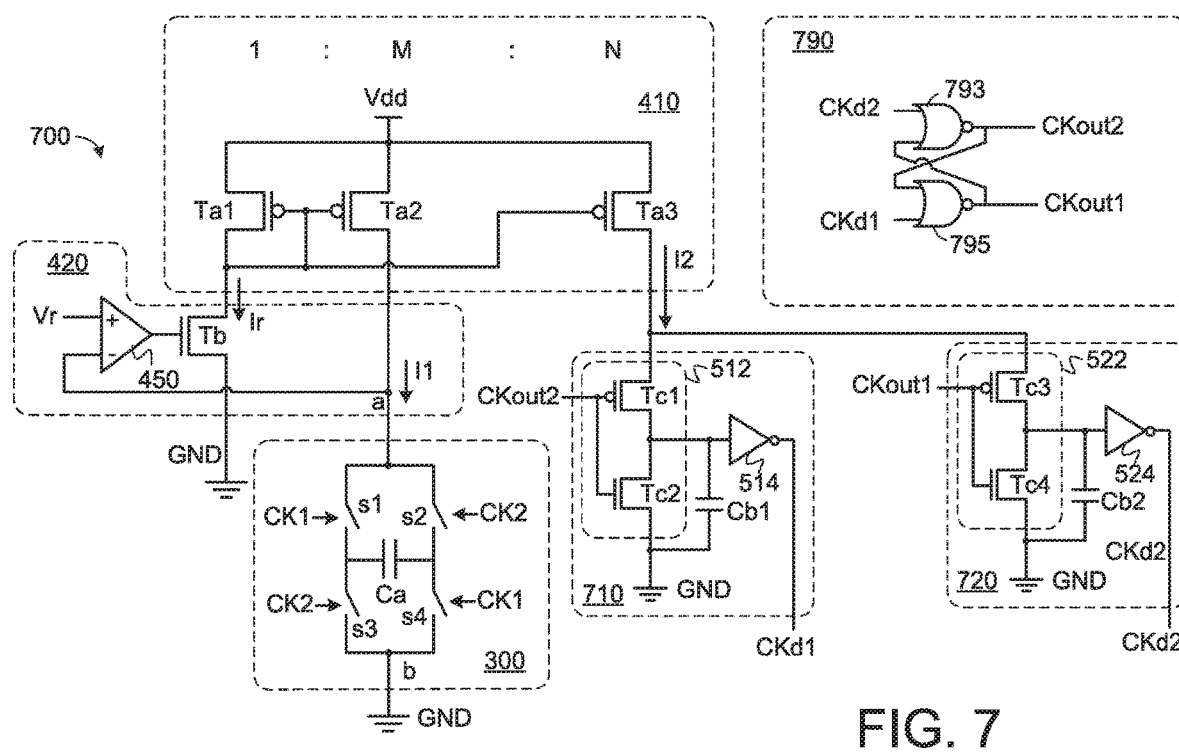
FIG. 7 is a schematic circuit diagram illustrating a frequency synthesizer according to an embodiment of the present invention.

FIG. 7 is a schematic circuit diagram illustrating a frequency synthesizer according to an embodiment of the present invention. As shown in FIG. 7, the frequency synthesizer 700 comprises a current mirror 410, a pseudo-resistor circuit 300, a voltage controller 420, two delaying circuits 710, 720 and a combinatorial logic circuit 790. The structures and the operating principles of the current mirror 410, the pseudo-resistor circuit 300 and the voltage controller 420 are identical to those of FIG. 5A, and not redundantly described herein.

In this embodiment, the two delaying circuits 710, 720 and the combinatorial logic circuit 790 are combined as a relaxation oscillator. The output terminal of the delaying circuit 710 generates a delayed clock signal CKd1 to the combinatorial logic circuit 790. The delaying circuit 720 generates a delayed clock signal CKd2 to the combinatorial logic circuit 790. The combinatorial logic circuit 790 generates an output clock signal CKout1 to the input terminal of the delaying circuit 710. The combinatorial logic circuit 790 generates an output clock signal CKout2 to the input terminal of the delaying circuit 720.

Since the circuitry structures of the delaying circuits 710 and 720 are identical, only the circuitry structure of the delaying circuit 720 will be described as follows. The delaying circuit 720 includes two inverters 522, 524 and a capacitor Cb2. The delaying circuit 720 has an input terminal and an output terminal. An input terminal of the inverter 522 is used as the input terminal of the delaying circuit 720. An output terminal of the inverter 524 is used as an output terminal of the delaying circuit 720. An output terminal of the inverter 522 is connected with an input terminal of the inverter 524. A first terminal of the capacitor Cb2 is connected with the output terminal of the inverter 522. A second terminal of the capacitor Cb2 is connected with the ground terminal GND. A first power terminal of the inverter 522 is connected with the second mirroring terminal of the current mirror 410. A second power terminal of the inverter 512 is connected with the ground terminal GND.

The inverter 522 comprises transistors Tc3 and Tc4. A first drain/source terminal of the transistor Tc3 is connected with the second mirroring terminal of the current mirror 410. A gate terminal of the transistor Tc3 and a gate terminal of the transistor Tc3 are connected with the input terminal of the inverter 522. A first drain/source terminal of the transistor Tc4 is connected with a second drain/source terminal of the transistor Tc3 and the output terminal of the inverter 544. A second drain/source terminal of the transistor Tc4 is connected with the ground terminal GND.

The combinatorial logic circuit 790 comprises two NOR gates 793 and 795. A first input terminal of the NOR gate 793 receives the delayed clock signal CKd2. A second input terminal of the NOR gate 793 is connected with an output terminal of the NOR gate 795. A first input terminal of the NOR gate 795 receives the delayed clock signal CKd1. A second input terminal of the NOR gate 795 is connected with an output terminal of the NOR gate 793. The output terminal of the NOR gate 793 generates the output clock signal CKout2. The output terminal of the NAND gate 795 generates the output clock signal CKout1.

During the operation of the frequency synthesizer 700, the two delaying circuits 710, 720 and the combinatorial logic circuit 790 are combined as the relaxation oscillator. The output clock signal CKout1 and the output clock signal CKout2 generated by the combinatorial logic circuit 790 are complementary to each other. The delaying time ΔTf may be expressed by the following formula: ΔTf=Tr/(2×N×m). Consequently, the frequency of each of the output clock signals CKout1 and CKout2 is equal to N×m×Fr.

Figure 8:
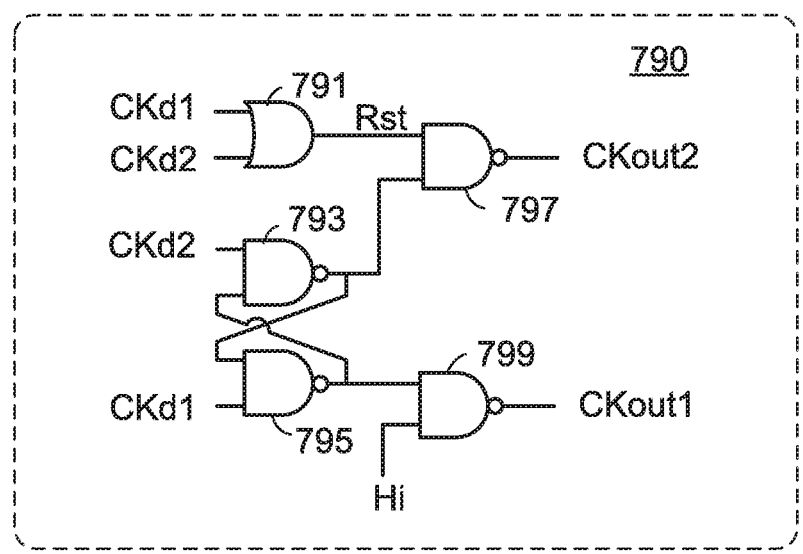
FIG. 8 is a schematic circuit diagram illustrating a variant example of the combinatorial logic circuit for the frequency synthesizer as shown in FIG. 7.

It is noted that the circuitry structure of the combinatorial logic circuit is not restricted. That is, the circuitry structure of the combinatorial logic circuit may be varied according to the practical requirements. FIG. 8 is a schematic circuit diagram illustrating a variant example of the combinatorial logic circuit for the frequency synthesizer as shown in FIG. 7.

As shown in FIG. 8, the combinatorial logic circuit 790 comprises an OR gate 791 and four NAND gates 793, 795, 797 and 799. A first input terminal of the OR gate 791 receives the delayed clock signal CKd1. A second input terminal of the OR gate 791 receives the delayed clock signal CKd2. An output terminal of the OR gate 791 is connected with a first input terminal of the NAND gate 797. A first input terminal of the NAND gate 793 receives the delayed clock signal CKd2. A second input terminal of the NAND gate 793 is connected with an output terminal of the NAND gate 795 and a first input terminal of the NAND gate 799. A first input terminal of the NAND gate 795 receives the delayed clock signal CKd1. A second input terminal of the NAND gate 795 is connected with an output terminal of the NAND gate 793 and a second input terminal of the NAND gate 797. A second input terminal of the NAND gate 799 receives a high voltage level (Hi). An output terminal of the NAND gate 797 generates the output clock signal CKout2. An output terminal of the NAND gate 799 generates the output clock signal CKout1.

Moreover, the OR gate 791 of the combinatorial logic circuit 790 generates a reset signal Rst according to the delayed clock signals CKd1 and CKd1. According to the reset signal Rst, the combinatorial logic circuit 790 is reset. Similarly, the combinatorial logic circuit 790 generates the output clock signals CKout1 and CKout2. The frequency of each of the output clock signals CKout1 and CKout2 is equal to N×m×Fr. The output clock signals CKout1 and CKout2 are complementary to each other.

From the above descriptions, the present invention provides a multiphase clock generator and an associated frequency synthesizer. The multiphase clock generator is designed according to the characteristics of the pseudo-resistor circuit. Consequently, the multiphase clock generator can generate plural delayed clock signals with a specified phase difference. Moreover, the multiphase clock generator of the present invention can accurately control the delaying time ΔTf in order to control the phase difference between the delayed clock signals. Moreover, the delayed clock signals are not influenced by the process, the voltage and the temperature. In other words, the output clock signals generated by the frequency synthesizer are not influenced by the process, the voltage and the temperature.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A multiphase clock generator, comprising:
a current mirror comprising a receiving terminal, a first mirroring terminal and a second mirroring terminal;
a voltage controller connected with the receiving terminal of the current mirror, wherein a feedback terminal of the voltage controller is connected with the first mirroring terminal of the current mirror;
a pseudo-resistor circuit, wherein a first terminal of the pseudo-resistor circuit is connected with the first mirroring terminal of the current mirror, and a second terminal of the pseudo-resistor circuit is connected with a ground terminal; and
a first delaying circuit connected with the second terminal of the pseudo-resistor circuit, wherein an input terminal of the first delaying circuit receives a first input clock signal, and an output terminal of the first delaying circuit generates a first delayed clock signal,
wherein the pseudo-resistor circuit comprises a first capacitor, a first switch, a second switch, a third switch and a fourth switch, wherein a first terminal of the first switch is connected with the first mirroring terminal of the current mirror, a second terminal of the first switch is connected with a first terminal of the first capacitor, a first terminal of the second switch is connected with the first mirroring terminal of the current mirror, a second terminal of the second switch is connected with a second terminal of the first capacitor, a first terminal of the third switch is connected with the ground terminal, a second terminal of the third switch is connected with the first terminal of the first capacitor, a first terminal of the fourth switch is connected with the ground terminal, and a second terminal of the fourth switch is connected with the second terminal of the first capacitor,
wherein the first switch and the fourth switch are operated according to a first control clock signal, and the second switch and the third switch are operated according to a second control clock signal.

2. The multiphase clock generator as claimed in claim 1, wherein the current mirror comprises:
a first transistor, wherein a first drain/source terminal of the first transistor receives a supply voltage, and a second drain/source terminal of the first transistor is the receiving terminal of the current mirror;
a second transistor, wherein a first drain/source terminal of the second transistor receives the supply voltage, a second drain/source terminal of the second transistor is the first mirroring terminal of the current mirror, and a gate terminal of the second transistor is connected with a gate terminal of the first transistor; and
a third transistor, wherein a first drain/source terminal of the third transistor receives the supply voltage, a second drain/source terminal of the third transistor is the second mirroring terminal of the current mirror, and a gate terminal of the third transistor is connected with the gate terminal of the first transistor.

3. The multiphase clock generator as claimed in claim 2, wherein an aspect ratio between the first transistor, the second transistor and the third resistor is 1:M:N.

4. The multiphase clock generator as claimed in claim 1, wherein the voltage controller comprises:

an operation amplifier, wherein a first input terminal of the operation amplifier receives a control voltage, and a second input terminal of the operation amplifier is connected with the first mirroring terminal of the current mirror; and
a control transistor, wherein a first drain/source terminal of the control transistor is connected with the receiving terminal of the current mirror, a second drain/source terminal of the control transistor is connected with the ground terminal, and a gate terminal of the control transistor is connected with an output terminal of the operation amplifier.

5. The multiphase clock generator as claimed in claim 4, wherein the voltage controller further comprises an inverter, wherein a first power terminal of the inverter receives the supply voltage, a second power terminal of the inverter is connected with the ground terminal, an input terminal of the inverter is connected with an output terminal of the inverter, and the output terminal of the inverter generates the control voltage.

6. The multiphase clock generator as claimed in claim 1, wherein the first delaying circuit comprises:
a first inverter, wherein a first power terminal of the first inverter is connected with the second mirroring terminal of the current mirror, a second power terminal of the first inverter is connected with the ground terminal, and an input terminal of the first inverter receives the first input clock signal;
a second capacitor, wherein a first terminal of the second capacitor is connected with an output terminal of the first inverter, and a second terminal of the second capacitor is connected with the ground terminal; and
a second inverter, wherein an input terminal of the second inverter is connected with an output terminal of the first inverter, and an output terminal of the second inverter generates the first delayed clock signal,
wherein the first input clock signal is identical to the second control clock signal.

7. The multiphase clock generator as claimed in claim 6, wherein the first inverter comprises:
a first transistor, wherein a first drain/source terminal of the first transistor is connected with the second mirroring terminal of the current mirror, a second drain/source terminal of the first transistor is connected with the first terminal of the second capacitor, and a gate terminal of the first transistor receives the second control clock signal; and
a second transistor, wherein a first drain/source terminal of the second transistor is connected with the second drain/source terminal of the first transistor, a second drain/source terminal of the second transistor is connected with the ground terminal, and a gate terminal of the second transistor receives the second control clock signal.

8. The multiphase clock generator as claimed in claim 6, further comprising a second delaying circuit and a combinatorial logic circuit, wherein the second delaying circuit is connected with the second mirroring terminal of the current mirror, an input terminal of the second delaying circuit is connected with the output terminal of the first delaying circuit, and an output terminal of the second delaying circuit generates a second delayed clock signal, wherein the combinatorial logic circuit receives the first delayed clock signal and the second delayed clock signal and generates an output clock signal.

9. The multiphase clock generator as claimed in claim 8, wherein there is a specified delaying time between the second control clock signal and the first delayed clock signal, and there is the specified delaying time between the first delayed clock signal and the second delayed clock signal, wherein a frequency of the output clock signal is related to a frequency of the second control clock signal.

10. The multiphase clock generator as claimed in claim 1, further comprising:
a second delaying circuit connected with the second mirroring terminal of the current mirror, wherein an input terminal of the second delaying circuit receives a second input clock signal, and an output terminal of the second delaying circuit generates a second delayed clock signal; and
a combinatorial logic circuit receiving the first delayed clock signal and the second delayed clock signal and generating a first output clock signal and a second output clock signal, wherein the first output clock signal is identical to the second input clock signal, and the second output clock signal is identical to the first input clock signal.

11. The multiphase clock generator as claimed in claim 10, wherein the first delaying circuit comprises:
a first inverter, wherein a first power terminal of the first inverter is connected with the second mirroring terminal of the current mirror, a second power terminal of the first inverter is connected with the ground terminal, and an input terminal of the first inverter receives the first input clock signal;
a second capacitor, wherein a first terminal of the second capacitor is connected with an output terminal of the first inverter, and a second terminal of the second capacitor is connected with the ground terminal; and
a second inverter, wherein an input terminal of the second inverter is connected with an output terminal of the first inverter, and an output terminal of the second inverter generates the first delayed clock signal.

12. The multiphase clock generator as claimed in claim 11, wherein the first delaying circuit comprises:
a third inverter, wherein a first power terminal of the third inverter is connected with the second mirroring terminal of the current mirror, a second power terminal of the third inverter is connected with the ground terminal, and an input terminal of the third inverter receives the second input clock signal;
a third capacitor, wherein a first terminal of the third capacitor is connected with an output terminal of the third inverter, and a second terminal of the third capacitor is connected with the ground terminal; and
a fourth inverter, wherein an input terminal of the fourth inverter is connected with an output terminal of the third inverter, and an output terminal of the fourth inverter generates the second delayed clock signal.

13. The multiphase clock generator as claimed in claim 12, wherein the first inverter comprises:
a first transistor, wherein a first drain/source terminal of the first transistor is connected with the second mirroring terminal of the current mirror, a second drain/source terminal of the first transistor is connected with the first terminal of the second capacitor, and a gate terminal of the first transistor receives the first input clock signal; and
a second transistor, wherein a first drain/source terminal of the second transistor is connected with the second drain/source terminal of the first transistor, a second drain/source terminal of the second transistor is connected with the ground terminal, and a gate terminal of the second transistor receives the first input clock signal.

14. The multiphase clock generator as claimed in claim 10, wherein there is a specified delaying time between the first input clock signal and the first delayed clock signal, and there is the specified delaying time between the second input clock signal and the second delayed clock signal, wherein a frequency of the first output clock signal is related to a frequency of the second control clock signal.

15. The multiphase clock generator as claimed in claim 10, wherein the combinatorial logic circuit comprises:
a first NOR gate, wherein a first input terminal of the first NOR gate receives the second delayed clock signal; and
a second NOR gate, wherein a first input terminal of the second NOR gate is connected with an output terminal of the first NOR gate, a second input terminal of the second NOR gate receives the first delayed clock signal, and an output terminal of the second NOR gate is connected with a second input terminal of the first NOR gate,
wherein the output terminal of the first NOR gate generates the second output clock signal, and the output terminal of the second NOR gate generates the first output clock signal.

16. The multiphase clock generator as claimed in claim 10, wherein the combinatorial logic circuit comprises:
a first NAND gate, wherein a first input terminal of the first NAND gate receives the second delayed clock signal;
a second NAND gate, wherein a first input terminal of the second NAND gate is connected with an output terminal of the first NAND gate, a second input terminal of the second NAND gate receives the first delayed clock signal, and an output terminal of the second NAND gate is connected with a second input terminal of the first NAND gate;
an OR gate, wherein a first input terminal of the OR gate receives the first delayed clock signal, and a second input terminal of the OR gate receives the second delayed clock signal;
a third NAND gate, wherein a first input terminal of the third NAND gate is connected with an output terminal of the OR gate, a second input terminal of the third NAND gate is connected with the output terminal of the first NAND gate, and an output terminal of the third NAND gate generates the second output clock signal; and
a fourth NAND gate, wherein a first input terminal of the fourth NAND gate is connected with the output terminal of the second NAND gate, a second input terminal of the fourth NAND gate receives a high voltage level, and an output terminal of the fourth NAND gate generates the first output clock signal.

* * * * *